United States Patent
Lin

(10) Patent No.: US 8,593,306 B2
(45) Date of Patent: Nov. 26, 2013

(54) HUFFMAN DECODER AND DECODING METHOD THEREOF

(75) Inventor: Han-Chi Lin, Hsinchu County (TW)

(73) Assignee: Mstar Semiconductor, Inc., Hsinchu County (TW)

( * ) Notice: Subject to any disclaimer, the term of this patent is extended or adjusted under 35 U.S.C. 154(b) by 72 days.

(21) Appl. No.: 13/220,057

(22) Filed: Aug. 29, 2011

(65) Prior Publication Data

US 2012/0274486 A1 Nov. 1, 2012

(30) Foreign Application Priority Data

Apr. 26, 2011 (TW) .............................. 100114516 A

(51) Int. Cl.
*H03M 7/40* (2006.01)
(52) U.S. Cl.
USPC ................ 341/65; 341/67; 341/106; 341/107
(58) Field of Classification Search
USPC ....................................... 341/65, 67, 106, 107
See application file for complete search history.

(56) References Cited

U.S. PATENT DOCUMENTS

| | | | |
|---|---|---|---|
| 5,604,498 A * | 2/1997 | Park | 341/65 |
| 6,219,457 B1 * | 4/2001 | Potu | 382/246 |
| 7,135,997 B2 * | 11/2006 | Oh | 341/106 |
| 7,567,186 B2 * | 7/2009 | Endress et al. | 340/945 |
| 7,728,745 B2 * | 6/2010 | Shigenobu et al. | 341/67 |
| 2005/0122240 A1 * | 6/2005 | Kim et al. | 341/65 |
| 2008/0266147 A1 * | 10/2008 | Shigenobu et al. | 341/67 |
| 2009/0251341 A1 * | 10/2009 | Chang | 341/65 |
| 2010/0195739 A1 * | 8/2010 | Lu et al. | 375/240.25 |
| 2010/0295712 A1 * | 11/2010 | Hallapuro et al. | 341/67 |
| 2011/0006931 A1 * | 1/2011 | Sun | 341/65 |

* cited by examiner

*Primary Examiner* — Linh Nguyen
(74) *Attorney, Agent, or Firm* — WPAT, PC; Justin King

(57) ABSTRACT

A Huffman decoder includes a storage module, a receiving module, and a determining module. The storage module stores a target path corresponding to a rare path. The receiving module receives a codeword in a source data stream and acquires corresponding path data for the codeword. The determining module compares the path data and the target path, and determines the codeword as the rare code when the path data and the target path are the same.

17 Claims, 4 Drawing Sheets

| symbol | path |
|---|---|
| 0 | 001 |
| 1 | 000 |
| 2 | 01 |
| 3 | 10 |
| 4 | 11 |

| symbol | path | path bit count |
|---|---|---|
| 1 | 000 | 3 |
| 0 | 001 | 3 |
| 2 | 010 | 2 |
| 3 | 100 | 2 |
| 4 | 110 | 2 |

| symbol | path | path bit count |
|--------|------|----------------|
| 1 | 0 | 3 |
| 0 | 1 | 3 |
| 2 | 2 | 2 |
| 3 | 4 | 2 |
| 4 | 6 | 2 |

| integrated column |
|-------------------|
| 0x013 |
| 0x103 |
| 0x222 |
| 0x432 |
| 0x642 |

HUFFMAN DECODER AND DECODING METHOD THEREOF

This application claims the benefit of Taiwan application Serial No. 100114516, filed Apr. 26, 2011, the subject matter of which is incorporated herein by reference.

BACKGROUND OF THE INVENTION

1. Field of the Invention

The invention relates in general to a decoding technique, and more particularly to a technique for optimizing efficiency of Huffman decoding.

2. Description of the Related Art

Huffman coding is a prevalent data compression technique in modern multimedia systems. A principle concept of the Huffman coding is that, the coding corresponding to a source symbol is determined according to an estimated probability of the occurrence of each source symbol in a stream of symbols to be compressed—a source symbol with higher probability of occurrence is given a shorter code, while another source symbol with lower probability of occurrence is given a longer code. A relationship between symbols and corresponding codes can be observed in a Huffman tree. Each coded codeword comprises a path data for indicating where the symbol corresponding to the codeword locates in the Huffman tree. A receiving end system then decodes received data according to the known Huffman tree.

Using an arbitrary prior art Huffman tree in FIG. 1 as an example, each leaf node, depicted as a block at a lowest terminal, denotes a symbol, and a code corresponding to each symbol is marked along a path between a root node and the leaf node. In this example, the code of a symbol 1 is 000, the code of a symbol 0 is 001, the code of a symbol 2 is 01, and so forth.

Under certain circumstances, to simplify the hierarchical structure of the Huffman tree, a coding system defines a plurality of source symbols having lower probabilities of occurrence as rare codes, and incorporates the rare codes in a single symbol (the symbol 0 is to be taken as an example below). In the prior art, each time a codeword is received, the decoding system searches bit by bit, from top to bottom, from the root node of the Huffman tree according to the path data of the codeword until the leaf node corresponding to the path data is identified. Supposing the symbol of the identified leaf node is 0, the decoder then performs a rare code decoding procedure on the codeword to retrieve the source symbol. Conversely, supposing the codeword is not a rare code, the decoding system directly regards the symbol identified according to the path data as a decoded result.

However, it remains a drawback in the prior art that, the decoding system is unable to determine whether a codeword is a rare code until fully tracking to a leaf node to identify that the codeword is corresponding to the symbol 0. The process for determining whether a codeword is a rare code is particularly time consuming for a Huffman tree having large or complicated hierarchies.

SUMMARY OF THE INVENTION

The invention is directed to a Huffman decoder and a decoding method thereof. By identifying a path corresponding to a rare code, in advance, the decoder and the decoding method thereof are capable of directly comparing whether path data of a codeword corresponds to a path of a rare code, so as to eliminate the process of determining correspondence bit by bit of a Huffman tree, in order to optimize decoding efficiency.

According to an aspect of the present invention, a Huffman decoder comprising a storage module, a receiving module, and a determining module is provided. The storage module stores a target path corresponding to a rare code. The receiving module receives path data of a codeword. The receiving module compares the path data and the target path, and determines that the codeword corresponds to the rare code when the path data and the target path are identical.

According to another aspect of the present invention, a Huffman decoding method is provided. A target path corresponding to a rare code is provided in advance. The method comprises steps of receiving path data of a codeword, comparing the path data and the target path, and determining that the codeword corresponds to the rare code when the path data and the target path are identical.

According to yet another aspect of the present invention, a computer-readable storage medium is provided. The computer-readable storage medium stores and executes a Huffman decoding code. A target path corresponding to a rare code is provided in advance. The Huffman decoding code comprises a first code for receiving path data of a codeword, a second code for comparing the path data and the target path, and a third code for determining that the codeword corresponds to the rare code when the path data and the target path are identical.

Compared to the prior art, the decoding method and decoder of the present invention offer a higher operating efficiency for determining whether a codeword is a rare code.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2A:
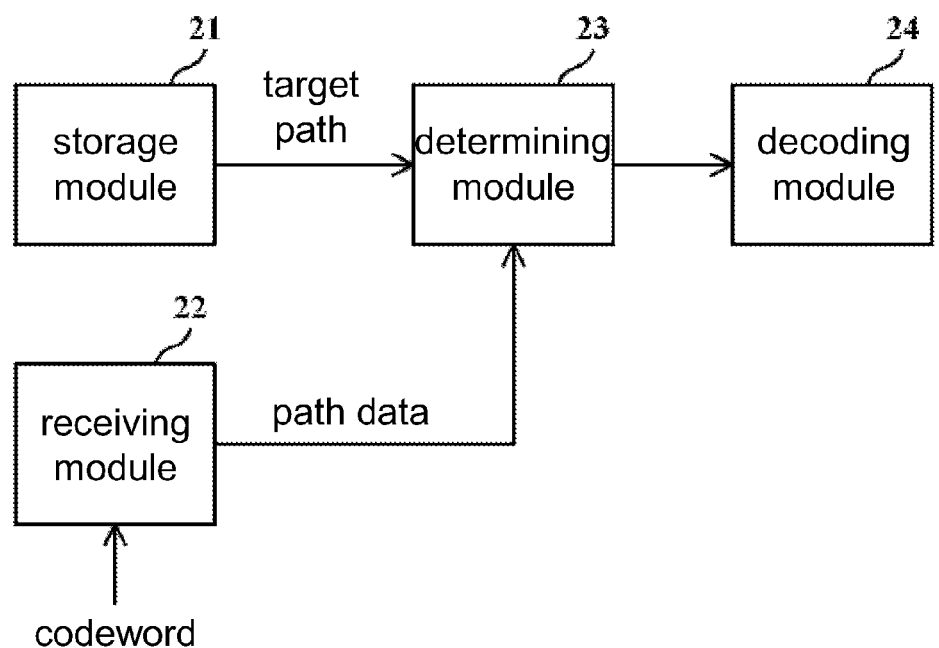
FIGS. 2A and 2B are block diagrams of a Huffman decoder according to an embodiment of the present invention.

FIG. 2A shows a block diagram of a Huffman decoder according to an embodiment of the present invention. The decoder comprises a storage module 21, a receiving module 22, a determining module 23, and a decoding module 24. In practice, the decoder may be implemented in a computer or a multimedia system adopting the Huffman coding, e.g., a low bit rate (LBR) decoder in a digital theater system (DTS).

Figure 1:
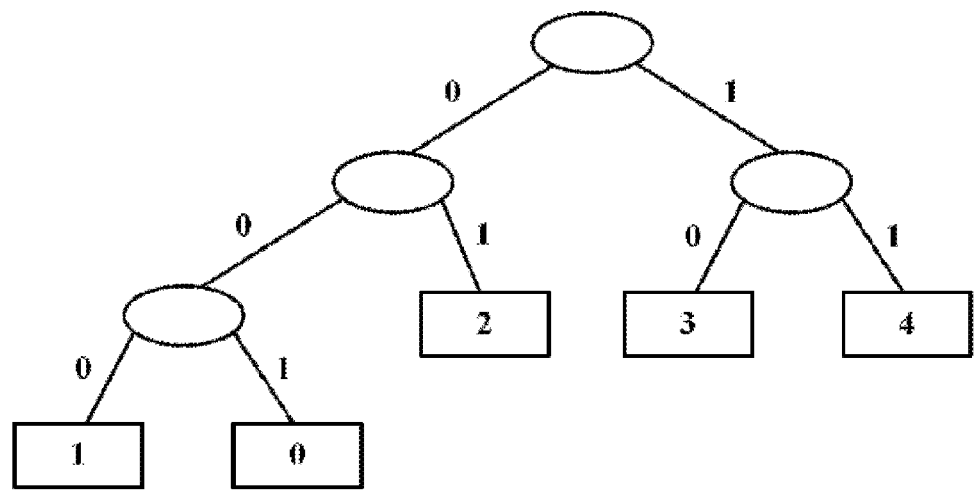
FIG. 1 is an example of an arbitrary prior art Huffman tree.

The storage module 21 stores a target path corresponding to a rare code. Using the Huffman tree shown in FIG. 1 as an example, supposing codewords in this embodiment only comprise one rare code, which is represented by a symbol 0, the corresponding path 001 is the foregoing target path. Since the decoder is acquainted with a content of the Huffman tree before receiving the codewords and the symbol representing the rare code is also known in advance, the target path may be indentified in advance according to the Huffman tree.

The receiving module 22 receives a codeword in a source data stream and acquires path data corresponding to the codeword. The path data indicates to which symbol in the Huffman tree the codeword corresponds. In the embodiment in FIG. 1, the codeword corresponds to the symbol 4 when the path data of the codeword is 11. The receiving module 22 then provides the path data to the determining module 23.

The storage module 21 provides the target path to the determining module 23, and the determining module 23 compares the path data of the codeword with the target path of the rare code. The determining module 23 determines that the codeword corresponds to the rare code when the path data and the target path are the same, and determines that the codeword does not correspond to the rare code when the path data and the target path are different. When the determining module 23 determines that the codeword corresponds to the rare code, the decoding module 24 proceeds to a rare code decoding procedure on the codeword to retrieve a source symbol of the rare code. Using the Huffman tree in FIG. 1 as an example, the determining module 23 determines that the codeword with the path data 001 corresponds to the rare code.

It can be observed from the above descriptions that, a decoder according to an embodiment of the present invention determines whether a codeword corresponds to the rare code by comparing whether the path data corresponding to the codeword is identical to the target path—such an approach eliminates the process of determining downward bit by bit tracking from the root node for the rare code, as performed in the prior art, so as to increase a speed of identifying the rare code.

In practice, when the determining module 23 determines that the codeword does not correspond to the rare code, the present invention provides various different approaches for identifying the symbol corresponding to the codeword. In an embodiment, when it is determined that the codeword does not correspond to the rare code, the decoder compares downward bit by bit tracking according to the Huffman tree to identify a symbol that the path data corresponds to, where the symbol is a decoded result of the codeword. In another embodiment, with reference to a block diagram in FIG. 2B, the decoder identifies the symbol corresponding to the codeword using a pre-established look-up table.

Figures 2B, 3A, 3B:
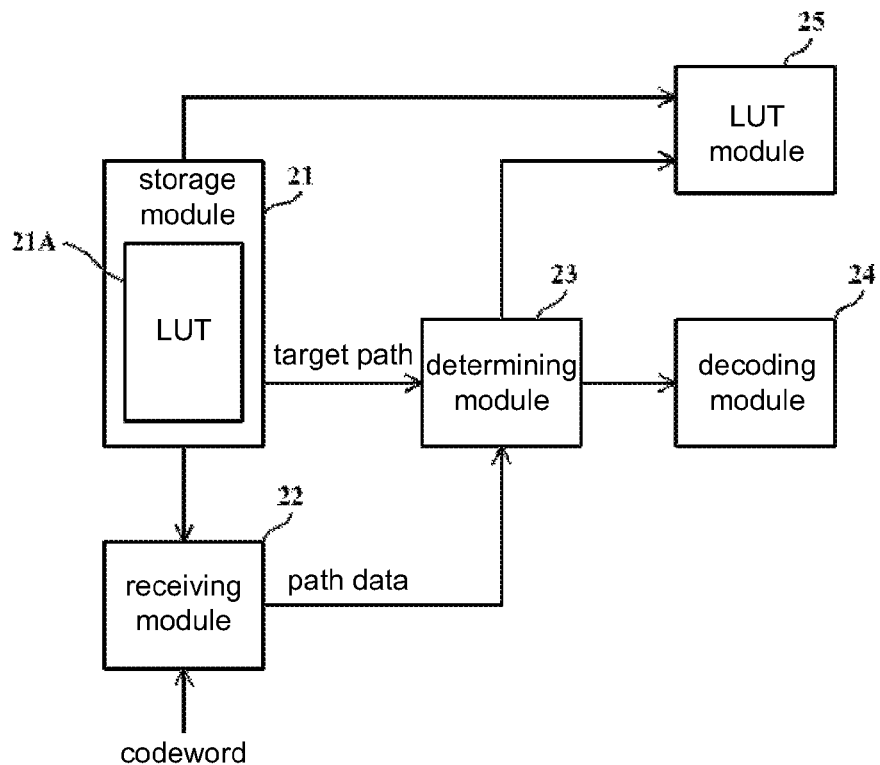
FIGS. 3A to 3D are examples of look-up tables (LUT) of the present invention.

As shown in FIG. 2B, the decoder further comprises a look-up table (LUT) module 25. In this embodiment, the storage module 21 stores a pre-established LUT 21A for storing a plurality of paths, each corresponding to a symbol and a leaf node of a Huffman tree, and the corresponding symbols for each path. Using the Huffman tree in FIG. 1 as an example, the LUT 21A may be designed to comprise a symbol column and a path column as shown in FIG. 3A. When the determining module 23 determines that the codeword does not correspond to the rare code, the LUT module 25 identifies the symbol corresponding to the codeword from the LUT 21A according to the path data. For example, when the path data is 11, the LUT module 25 identifies that the codeword corresponds to the symbol 4 according to the LUT 21A.

A basic principle of the Huffman coding is that among all symbols, a rare code corresponds to a codeword of the longest code length; that is, the rare code has the largest path bit (i.e. number of bits of the path). The path bit of the rare code in the above embodiment is 3. In another embodiment, the LUT 21A is designed to include a symbol column, a path column and a path bit column as shown in FIG. 3B. It is to be noted that, in this embodiment, the path bit of the rare code is also 3. To facilitate comparison operations, all paths corresponding to Huffman codewords are padded with padding bits to become new paths of a maximum path bit 3 (i.e., the maximum path bit among the original path bits). More specifically, a plurality of zeros are added to a least significant bit (LSB) of the paths of the symbols 2, 3, and 4, so as to provide new paths having a same path bit as the maximum path bit 3.

In FIG. 3B, the rightmost path bit column is for recording a path bit of the original paths. In this column, it is also observed that the maximum path bit is 3. This maximum path bit is recorded in the storage module 21 in advance to be referenced by the receiving module 22. For example, the receiving module 22 determines how many bits of data are to be captured from an original data stream according to the maximum path bit to serve as the path data. It is to be noted that, according to features of the Huffman decoding, it is mandatory that the bit number of the rare code be equaled to the maximum path bit length. Furthermore, in this embodiment, the new paths are incrementally arranged in the LUT 21A to facilitate identification of the symbol corresponding to the codeword by the LUT module 25.

In this embodiment, the LUT module 25 identifies the symbol corresponding to the codeword by comparing the path data and values of the new paths. When identifying the corresponding symbol, the LUT module 25 incrementally compares the path data with values of the new paths until the path data is found to be smaller than a new path. The LUT module 25 then determines a new path previous to the new path as a new target path, and the symbol corresponding to the new target path is hereby the symbol corresponding to the codeword. For example, as shown in FIG. 3B, suppose the receiving module 22 captures the path data by the maximum path bit 3, and the received path data is 100. The LUT module 25 sequentially compares the new paths 000, 001, 010, 100 and 110 in the path column with the path data 100 until it discovers that the new path 110 is greater than the path data 100. The LUT module 25 then determines the previous new path 100 as the new target path, and the symbol 3 corresponding to the new target path is the symbol corresponding to the codeword.

In another example, as shown in FIG. 3B, suppose the receiving module 22 captures the path data by the maximum path bit 3, and the received path data is 011. The LUT module 25 sequentially compares the new paths 000, 001, 010 and 100 in the path column with the path data 011 until it discovers that the new path 100 is greater than the path data 011. The LUT module 25 then determines the previous new path 010 as the new target path, and the symbol 2 corresponding to the new target path is the symbol corresponding to the codeword. It is to be noted that, in this embodiment, the received path data 011 may not be equaled to any of the new paths. Since the path bit corresponding to the codeword is 2, it means that only the first two bits in the original data stream are in fact utilized to represent the path of the codeword. In other words, apart from the data of the first two bits, values of the remaining smaller bits are trivial, for the first two bits 01 of the path data 011 captured by the receiving module corresponds to the codeword while the third bit 1 in fact belongs to the path data of a next codeword. Therefore, the LUT module 25 may effectively disregard a difference between the new target path and the path data resulting from the padding bits (a total bit number of the padding bits thereof equals the maximum path bit minus the path bit of the new target path) in the new target path, so as to effectively identify the symbol corresponding to the codeword.

It is to be noted that, in this embodiment, the path bit corresponding to the new target path is also provided to the receiving module 22, allowing the receiving module 22 to accordingly capture of path data corresponding to the next codeword accurately. Using the path data 011 as an example, it is necessary for the receiving module 22 to perceive that the third bit 1 belongs to the path data of the next codeword to prevent misjudgment when capturing the path data of the next codeword.

Figures 3C, 3D, 4:
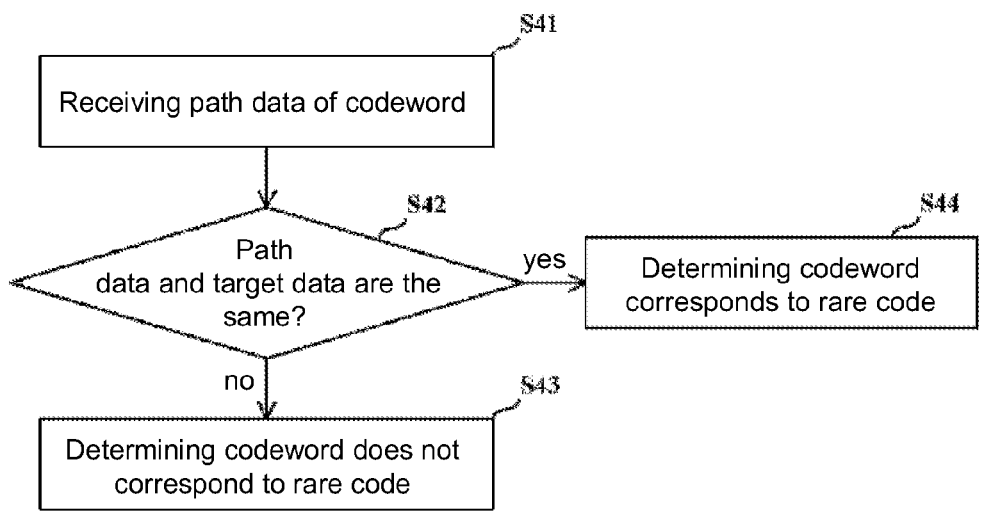
FIG. 4 is a partial flowchart of a Huffman decoding method according to an embodiment of the present invention.

In another embodiment, the LUT 21A is designed to convert the path data from binary data to decimal data and incrementally arrange the decimal data, as shown in FIG. 3C. Such incremental arrangement provides an advantage for the LUT module 25 in increasing efficiency of comparison. As shown in FIG. 3D, contents of columns in FIG. 3C may also be integrated into one column; that is, symbols, paths, and path bits can be recorded in a single column, and a maximum path bit is regarded as 12.

FIG. 4 shows a partial flowchart of a Huffman decoding method according to another embodiment of the present invention. A target path corresponding to a rare code is provided in advance. The method begins with Step S41 to receive path data of a codeword. In Step S42, the path data and the target path are compared to determine whether they are identical. When a determination result from Step S42 is negative, the method proceeds to Step S43 to determine that the codeword does not correspond to the rare code. Conversely, when the determination result from Step S42 is affirmative, the method proceeds to Step S44 to determine that the codeword corresponds to the rare code.

Figure 5:
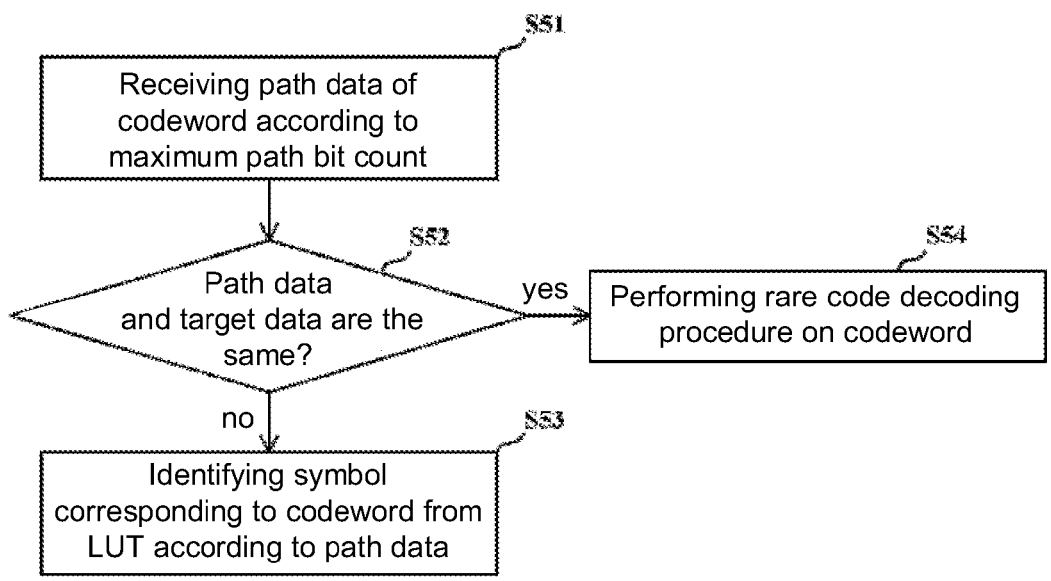
FIG. 5 is a flowchart of a Huffman decoding method according to an embodiment of the present invention.

FIG. 5 shows a flowchart further comprising a decoding procedure. Step S51 and Step S52 are identical to the two steps S41 and S42 in FIG. 4. When a determination result from Step S52 is negative, the method performs Step S53 to identify a symbol corresponding to the codeword from a pre-established LUT according to the path data. Conversely, when the determination result from Step S52 is affirmative, the method proceeds to Step S54 to perform a rare code decoding procedure.

In practice, the decoding module 24 and the LUT module 25 in FIG. 2B may be integrated into a single module. Furthermore, the flows shown in FIG. 4 and FIG. 5 may be realized by the hardware structure shown in FIG. 2B. Similarly, the LUT in Step S53 may be any type from FIG. 3A to FIG. 3D, but is not limited thereto.

According to yet another embodiment of the present invention, a computer-readable storage medium capable of reading and executing a Huffman decoding code is provided. For example, the computer-readable storage medium can be an optical storage medium, a soft disc, or a hard disc. The Huffman decoding code comprises a first code for receiving path data of a codeword, a second code for comparing the path data and the target path, and a third code for determining that the codeword corresponds to the rare code when the path data and the target path are the same.

As stated above, it is illustrated that the decoder and decoding method of the present invention directly compares the path data of the codeword with the path corresponding to the rare code by employing the pre-identified paths corresponding to the rare code, so as to eliminate the process of sequentially tracking the Huffman tree and optimize the decoding efficiency. Compared to the prior art, the decoding method and decoder of the present invention offer higher operating efficiency for determining whether a codeword is a rare code.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Huffman decoder, comprising:
    a storage module, for storing a plurality of target paths, one of the plurality of target paths being associated with a rare code, wherein a plurality of source symbols with lower probabilities of occurrence are defined as rare codes and incorporates the rare codes in a single symbol;
    a receiving module, for receiving a codeword and acquiring path data corresponding to the codeword; and
    a determining module, for comparing the path data and the target path associated with the rare code, and determining that the codeword corresponds to the rare code when the path data and the target path are identical.

2. The Huffman decoder according to claim 1, further comprising:
    a decoding module, for performing a rare code decoding procedure when the determining module determines that the codeword corresponds to the rare code.

3. The Huffman decoder according to claim 1, wherein the storage module further stores a maximum path bit, and a path bit of the path data received by the receiving module is determined according to the maximum path bit.

4. The Huffman decoder according to claim 1, the storage module storing a pre-established look-up table (LUT) for storing a plurality of paths and a plurality of symbols corresponding to the plurality of paths respectively, each of the plurality of paths in the LUT being associated with a leaf node of a Huffman tree, the Huffman decoder further comprising:
    a look-up module, for identifying the symbol corresponding to the codeword from the LUT according to the path data when the determining module determines that the codeword does not correspond to the rare code.

5. The Huffman decoder according to claim 4, wherein each of the paths and the corresponding symbol are stored in a same column in the LUT.

6. The Huffman decoder according to claim 4, wherein the paths are respectively transformed into values which are incrementally arranged in the LUT.

7. The Huffman decoder according to claim 4, wherein the LUT further stores a path bit corresponding to each of the paths, and the receiving module refers to the path bit corresponding to the codeword when receiving path data of a next codeword.

8. A Huffman decoding method, comprising:
    providing a target path associated with a rare code;
    receiving path data associated with a codeword;
    comparing the path data and the target path; and
    determining that the codeword corresponds to the rare code when the path data and the target path are identical, wherein a source symbol with lower probability of occurrence is defined as the rare code and incorporates the rare code in a single symbol.

9. The method according to claim 8, further comprising:
    performing a rare code decoding procedure on the codeword when the codeword corresponds to the rare code.

10. The method according to claim 8, wherein with a maximum path bit set in advance, the step of receiving the path data of the codeword comprises determining a path bit of the path data to be received according to the maximum path bit.

11. The method according to claim 8, with a look-up table (LUT) provided in advance for storing a plurality of paths and corresponding symbols, each of the paths in the LUT being associated with a leaf node of a Huffman tree, the Huffman decoding method further comprising:
    identifying the symbol corresponding to the codeword from the LUT according to the path data when the codeword does not correspond to the rare code.

12. The method according to claim 11, wherein each of the plurality of paths and the corresponding symbol are stored in a same column in the LUT.

13. The method according to claim 11, wherein the plurality of paths are respectively transformed into values and are incrementally arranged in the LUT.

14. The method according to claim 11, wherein the LUT further stores a path bit corresponding to each of the plurality of paths, and the step of identifying the symbol comprises referring to the path bit corresponding to the codeword when receiving path data of a next codeword.

15. A non-transitory computer-readable storage medium, storing a Huffman code readable and executable by a controller, with a target path corresponding to a rare code set in advance, the non-transitory computer-readable storage medium comprising:
- a first code, for receiving path data of a codeword;
- a second code, for comparing the path data and the target path; and
- a third code that determines the codeword corresponds to the rare code when the path data and the target path are identical, wherein a source symbol with lower probability of occurrence is defined as the rare code and incorporates the rare code in a single symbol.

16. The non-transitory computer-readable storage medium according to claim 15, further comprising:
- a fourth code, for performing a rare code decoding procedure when the codeword corresponds to the rare code.

17. The non-transitory computer-readable storage medium according to claim 15, with a look-up table (LUT) provided in advance for storing a plurality of paths and a plurality of corresponding symbols, each of the plurality of paths in the LUT being associated with a leaf node of a Huffman tree, the computer-readable storage medium further comprising:
- a fifth code, for identifying the symbol corresponding to the codeword from the LUT according to the path data when the codeword does not correspond to the rare code.

* * * * *